United States Patent [19]

Saitou et al.

[11] 4,396,901
[45] Aug. 2, 1983

[54] METHOD FOR CORRECTING DEFLECTION DISTORTION IN AN APPARATUS FOR CHARGED PARTICLE LITHOGRAPHY

[75] Inventors: Norio Saitou, Iruma; Susumu Ozasa, Kashiwa; Katsuhiro Kuroda, Hachioji, all of Japan

[73] Assignee: Hitachi, Ltd., Tokyo, Japan

[21] Appl. No.: 227,940

[22] Filed: Jan. 23, 1981

[30] Foreign Application Priority Data

Jan. 23, 1980 [JP] Japan ................................. 55/5675

[51] Int. Cl.³ ...................... H01J 29/70; G06K 7/10
[52] U.S. Cl. .................................... 382/8; 315/370; 356/357; 356/371; 356/373; 364/563; 364/571; 382/61; 382/66
[58] Field of Search ............... 315/369, 370, 371, 372; 356/341, 342, 371, 373, 375–377, 30, 121, 445, 345, 354–358, 363; 364/515, 571, 562, 563; 358/67–70, 139; 340/146.3 F, 146.3 H, 146.3 AH

[56] References Cited

U.S. PATENT DOCUMENTS

| | | | |
|---|---|---|---|
| 3,743,883 | 7/1973 | Burns | 315/369 |
| 3,861,804 | 1/1975 | Lehmbeck | 356/357 |
| 4,053,234 | 10/1977 | McFarlane | 356/445 |
| 4,099,092 | 7/1978 | Bristow | 315/370 |
| 4,160,935 | 7/1979 | Groot et al. | 315/370 |
| 4,203,051 | 5/1980 | Hallett et al. | 315/370 |
| 4,291,990 | 9/1981 | Takasu | 356/371 |
| 4,332,477 | 6/1982 | Sato | 356/376 |
| 4,355,900 | 10/1982 | Nussmeier | 356/358 |
| 4,358,201 | 11/1982 | Makosch | 356/357 |

OTHER PUBLICATIONS

Jones et al., "Design Aspects of a Scanning Electron-Beam-Microfabrication Instrument . . . ," *J. Vac. Sci. Technol.*, vol. 15, No. 3, May/Jun. 1978, pp. 896–900.

Asai et al., "Distortion Correction and Deflection Calibration . . . ," *J. Vac. Sci. Technol.*, vol. 16, No. 6, Nov./Dec. 1979, pp. 1710–1714.

*Primary Examiner*—Leo H. Boudreau
*Attorney, Agent, or Firm*—Antonelli, Terry & Wands

[57] ABSTRACT

In a method for correcting deflection distortion which develops in an apparatus for delineating a pattern on a sample by scanning a charged particle beam thereover, the corrections of the deflection distortions are made in accordance with the height (deformation) of a portion-to-be-delineated on a sample (for example, a wafer) on the basis of correction magnitudes of the deflection distortions at respective reference levels of a mark as obtained by scanning the charged particle beam on the mark which has at least two reference levels having unequal heights in the direction of an optical axis.

11 Claims, 5 Drawing Figures

METHOD FOR CORRECTING DEFLECTION DISTORTION IN AN APPARATUS FOR CHARGED PARTICLE LITHOGRAPHY

BACKGROUND OF THE INVENTION

This invention relates to a method for correcting deflection distortion which develops in an apparatus for delineating patterns on a sample by scaning over the sample with a charged particle beam, such as electron beam or an ion beam; for example, an apparatus for electron beam lithography.

In general, in an apparatus for electron beam lithography and the like, the deflection field is distorted on account of fabrication errors in the apparatus itself, the installation errors of an electron lens and a deflector, and so on. That is, when the deflection data is in the form of a checkered lattice, the phenomenon that a delineated result becomes a distorted lattice takes place. In order to permit the registration between masks prepared by different apparatuses, such deflection distortion must be eliminated.

Especially in an apparatus for mask exposure, a correction method as illustrated in FIG. 1 has been proposed by G. A. C. Jones and G. Owen: Journal of Vacuum Science and Technology, 15(3), May/June, 1978, for correcting the distortion. As seen in FIG. 1, a single reference mark 1 is provided on a part of a work table 2. The work table 2 is moved to change the relative position of the mark with respect to a beam axis, and this position is measured with laser interferometers 3 and 4. Simultaneously therewith, while applying deflection data from a control computer (CPU) 7 to a deflector 6, the area of the mark 1 is scanned by an electron beam 5 so as to detect the position of the mark 1. Thus, the distortion of the deflection is measured. If the data can be corrected so that the distortion apparently disappears, it is determined that the correction of the deflection distortion has been accomplished.

Although this distortion correction method provides a satisfactory precision for the exposure of the mask or a wafer of small diameter, the correction method alone is unsatisfactory in, for example, an apparatus for the direct exposure of a device which has dimensions of submicrons requiring a high precision within ±0.1 μm. This is because the wafer itself generally has a deformation. By way of example, when the wafer is greater than 3″, the magnitude of the deformation thereof becomes greater than 200 μm in the standard semiconductor manufacturing process. Accordingly, the focus, deflection gain, deflection rotation, barrel or pincushion, and other distortions need to be corrected for every field to be delineated in the "step and repeat" process.

As an expedient for reforming the deformation of the wafer, there has been proposed an electrostatic chuck system as suggested by G. A. Wardly: Review of Scientific Instrument, Vol. 44, 1506, 1973. However, this system has not been put into practical use in view of the structural complexity etc., thereof.

SUMMARY OF THE INVENTION

This invention has been made in response to the problems in the prior art as described above, and has for its object to provide a method for correcting deflection distortion in consideration of the deformation of a wafer (or bowed wafers) in an apparatus for charged particle lithography.

In order to accomplish this object, the present invention comprises the step of scanning a charged particle beam on a mark having at least two reference levels whose heights are unequal in the direction of an optical axis, the step of calculating correction magnitudes of the deflection distortions at the respective reference levels as obtained by the scanning step, the step of measuring the height of a portion-to-be-delineated on a sample, and the step of correcting the deflection distortions on the basis of said correction magnitudes and in accordance with said height of said portion-to-be-delineated on said sample.

DETAILED DESCRIPTION OF THE PREFERRED EMBODIMENTS

Hereunder, this invention will be described with reference to various exemplary embodiments.

Figure 1:
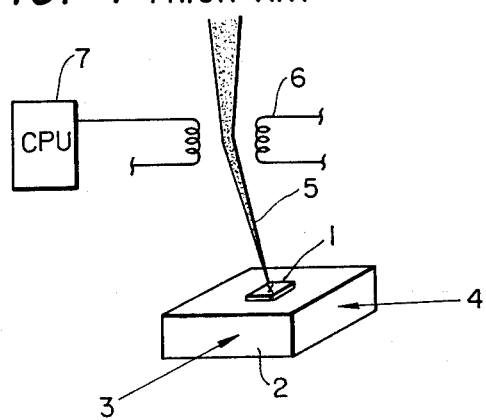
FIG. 1 is a view for explaining a prior art method for correcting deflection distortion.
Figure 2:
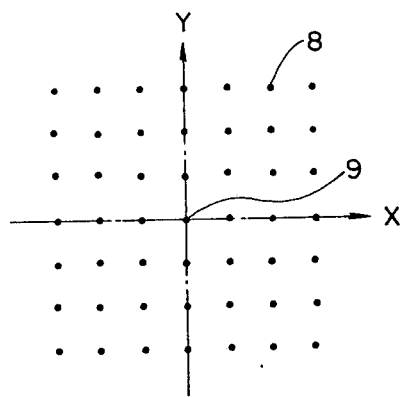
FIG. 2 is a diagram showing lattice points to which a reference mark is moved relative to an origin.

First of all, there will be explained an example of a method of detecting deflection distortion. FIG. 2 shows lattice points to which a reference mark 8 is moved relative to an origin (beam axis) 9. First, the mark is located at the origin 9, and an electron beam is scanned on the mark. Under this state, back-scattered electrons from the mark are detected with a solid-state detector or the like. Then, data necessary for deflecting the beam to the mark center is obtained. Subsequently, the mark is moved to a lattice point separate from the origin. The distance of the movement relative to the origin can be precisely measured with a laser interferometer or the like. The electron beam is scanned on the mark again, to obtain deflection data necessary for deflecting the beam to the mark center. If this deflection data is equal to the sum between the preceding deflection data of the mark center and the movement distance measured by the laser interferometer, no distortion is involved in the deflection of the electron beam. Usually, however, they do not become equal because of the presence of distortion.

The above operations are performed for all the lattice points shown in FIG. 2. The number of the lattice points is properly determined according to a required precision. In this way, sets of lattice point coordinates ($X_{Li}$, $Y_{Li}$), the relative positions of which are known, and the electron beam deflection data ($X_i$, $Y_i$) are obtained. The deflection distortion within an electron beam scanning field can be known from the set.

In an apparatus for electron beam lithography, it is necessary that when the deflection data ($X_i$, $X_i$) is given, the beam is deflected to the position ($X_i$, $Y_i$). To this end the following coordinate transformation must be made so as to supply modified data (U, V) to the electron beam apparatus:

$$U = X + F_1(X, Y) \brace V = Y + F_2(X, Y)} \quad (1)$$

where $F_1(X, Y)$ and $F_2(X, Y)$ denote small correction magnitudes. As the shapes of the functions, the following are considered by way of example:

$$\left. \begin{array}{l} F_1(X, Y) = A_0 + A_1X + A_2Y + A_3X^2 + A_4XY \\ \qquad + A_5Y^2 + A_6X^3 + A_7X^2Y \\ \qquad + A_8XY^2 + A_9Y^3 \\ F_2(X, Y) = B_0 + B_1X + B_2Y + B_3X^2 + B_4XY \\ \qquad + B_5Y^2 + B_6X^3 + B_7X^2Y \\ \qquad + B_8XY^2 + B_9Y^3 \end{array} \right\} \quad (2)$$

The respective terms of the corrections in the above expressions (2) can be given the following physical meanings. Coefficients $A_o$ and $B_o$ denote shift terms, while coefficients $A_1$ and $B_2$ denote the deflection distortions of deflection gains, coefficients $A_2$ and $B_1$ denote deflection distortions of rotations, and so forth. The correction coefficients A and B of the respective distortions can be evaluated by a suitable method (for example, the method of least squares) from the foregoing set of the lattice point coordinates ($X_{Li}$, $Y_{Li}$) and the deflection data ($X_i$, $Y_i$).

As stated before, when a wafer is greater than 3", it exhibits a deformation magnitude greater than 200 $\mu$m in the standard semiconductor manufacturing process. In this regard, the values of the correction coefficients A and B in Expression (2) are naturally different at unequal levels. For example, the correction terms $A_1X$ and $B_2Y$ of the deflection gains in the above Expression (2) give rise to differences of several $\mu$m at the exposure field ends of an upper level and a lower level on the assumption that the deformation of the wafer is 200 $\mu$m. Therefore, the correction coefficients $A_1$ and $B_2$ ought to be different values for the upper level and for the lower level. This applies, not only to the gain terms, but also to the rotation terms, trapezoid terms, etc.

This invention has therefore permitted the correction of the deflection distortions with the deformation of the wafer taken into account by employing the distortion detecting method as stated above.

Figure 3:
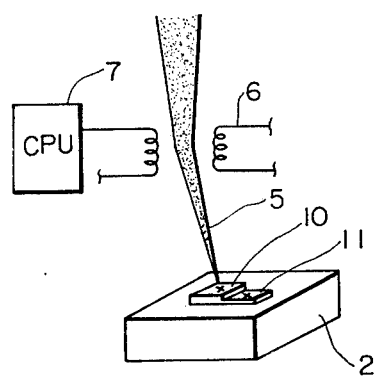
FIG. 3 is a view for explaining an embodiment of this invention.

FIG. 3 is a view for explaining an embodiment of this invention. On a work table 2 on which a wafer is to be placed, there are provided reference marks 10 and 11 of two levels whose relative heights are known. In advance of exposure, deflection distortions are detected for the respective marks by the foregoing method. In other words, the correction coefficients $A^l_i$, $B^l_i$ and $A^h_i$, $B^h_i$ of Expression (2) are evaluated at the lower level $Z=Z_l$ (Z signifies the height ordinate) and the upper level $Z=Z_h$.

Figure 4:
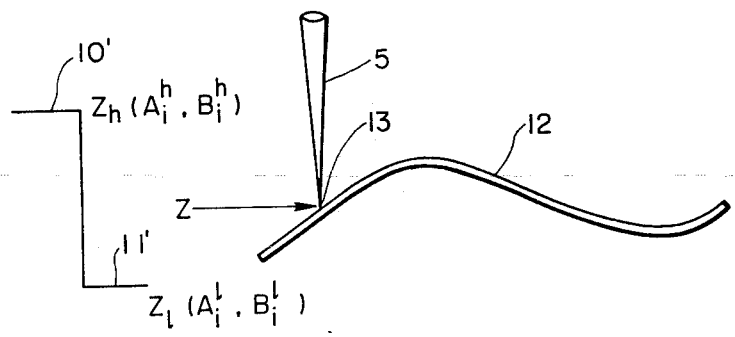
FIG. 4 is a view for explaining the fundamental principle of this invention.

The heights (Z values) of the marks of the two levels are desired to be such that the height of the wafer to be delineated lies roughly between the two marks 10 and 11 with the deformation of the wafer considered. This situation is illustrated in FIG. 4. In the figure numerals 10' and 11' indicate the reference marks of the upper level and the lower level, respectively, and numeral 12 designates a sample (for example, a wafer). In the "step and repeat" process, the level of each field 13 to be delineated is measured by means of a level detector, for example, a Z sensor utilizing light (refer to Japanese Patent Application Laid-Open Specification No. 52-57842) in advance. The electric capacitance method, an optical micrometer, etc., may well be used for the level detection. It is now supposed that a value of the level $Z=Z_i$ has been obtained. At this time, the correction coefficients $A_i$ and $B_i$ of the deflection distortions of the particular field can be determined by performing an operation of an appropriate interpolation in CPU 7, for example, from the following expressions by employing $A^l_i$, $B^l_i$ and $A^h_i$, $B^h_i$.

$$\frac{A_i - A^l_i}{A^h_i - A^l_i} = \frac{B_i - B^l_i}{B^h_i - B^l_i} = \frac{Z - Z_l}{Z_h - Z_l} \quad (3)$$

(where $i = 0, 1, 2 \ldots$ and 9).

Figure 5:
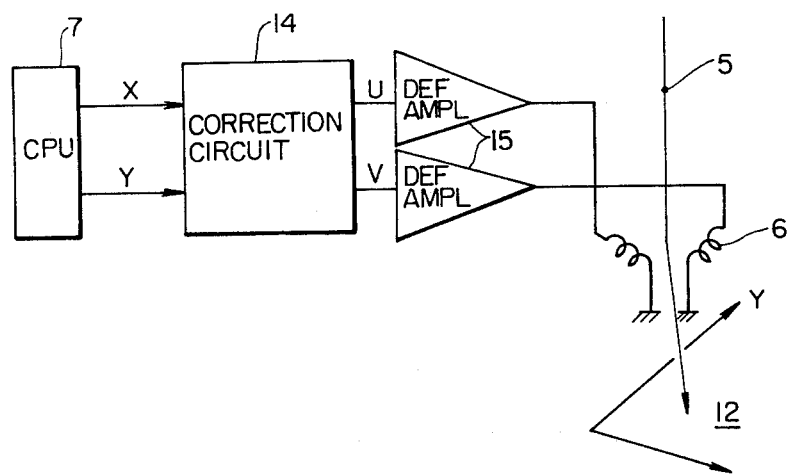
FIG. 5 is a schematic block diagram showing an example of a deflection distortion correction circuit in accordance with this invention.

The data (U, V) modified (coordinate-transformed) with $A_i$ and $B_i$ thus obtained and in accordance with the foregoing expressions (1) and (2) is supplied to the electron beam apparatus. This situation is illustrated in FIG. 5. Referring to the figure, when given coordinate data X and Y is designated by a CPU 7, the small correction magnitudes $F_1(X, Y)$ and $F_2(X, Y)$ are respectively added thereto in a correction circuit 14 by using the coefficients Ai, Bi from CPU 7 which are set in the circuit 14, and its outputs $U=X+F_1(X, Y)$ and $V=Y+F_2(X, Y)$ are supplied to the deflection system of the apparatus for charged particle lithography. Thus, the electron beam will be deflected to the position of X and Y precisely. In the figure numeral 15 indicates deflection amplifiers.

In this method, it is assumed that the respective coefficients of the deflection distortions change linearly between $Z=Z_l$ and $Z=Z_h$. In the case where the assumption results in an unsatisfactory precision, a reference mark may be provided at another level $Z=Z_m$ midway between $Z=Z_l$ and $Z=Z_h$, correction coefficients $A_i^m$ and $B_i^m$ being evaluated at that level in advance. It is also possible to make quadratic corrections on the basis of the values of the correction coefficients at the three levels and in accordance with the Z value of each field to be delineated. Alternatively, if the field to be delineated lies, for example, between the lower level and the medium level, the correction coefficients can be evaluated from the reference values of the lower level and the medium level by linear interpolation as in the above Expression (3). It is also possible to make finer corrections by providing four or more reference levels. The values i in the correction coefficients $A_i$ and $B_i$ have been explained to be $i=0, 1, 2, \ldots$ and 9 in the above example. This invention, however, is not restricted to the aforecited values but can set appropriate values in dependence on set conditions.

As set forth above, according to this invention, marks of at least two unequal levels are used to obtain correction values of deflection distortions at the respective levels and the correction values are employed as references, whereby corrections of deflection distortions with the deformation of a portion-to-be-delineated taken into account are possible. The invention is greatly effective when put into practical use.

We claim:

1. A method for correcting deflection distortion which appears in an apparatus for delineating patterns on a sample by scanning the sample with a charged particle beam comprising:
   scanning the charged particle beam on a mark having at least two reference levels whose heights are unequal in the direction of a predetermined optical axis;

calculating the correction magnitudes of the deflection distortions at the respective reference levels as obtained by the scanning step;

measuring the height of a portion-to-be-delineated on the sample; and correcting the deflection distortions on the basis of said correction magnitudes and in accordance with said height of said portion-to-be-delineated on said sample.

2. A method for correcting deflection distortion as defined in claim 1, wherein the corrections of the deflection distortions are made by interpolation on the basis of said correction magnitudes of said deflection distortions at said respective reference levels.

3. A method for correcting deflection distortion as defined in claim 1 or 2, wherein the two reference levels are set so that the height of said sample at said portion-to-be-delineated may lie therebetween with a deformation of said sample taken into account.

4. A method for correcting deflection distortion as defined in claim 3, wherein the corrections of the deflection distortions are made in accordance with the height of every portion-to-be-delineated on said sample.

5. A method for correcting deflection distortion as defined in claim 3, wherein said mark is provided at a part of a work table on which said sample is placed.

6. A method for correcting deflection distortion as defined in claim 5, wherein said mark has two reference levels whose relative heights are known.

7. A method for correcting deflection distortion which appears in an apparatus for delineating a pattern on a sample by scanning a charged particle beam, comprising:

scanning the charged particle beam on a mark and obtaining deflection data necessary for deflecting the beam to a center of said mark each time said mark is moved by a fixed interval, said mark being provided at a part of a movable work table on which the sample is to be placed and having at least two unequal reference levels whose relative heights are known;

calculating correction magnitudes of the deflection distortions concerning the respective reference levels of said mark at each moved position of said mark from said deflection data and the distance of the movement of said mark;

measuring the height of a portion-to-be-delineated on said sample; and correcting the deflection distortions on the basis of said correction magnitudes and in accordance with said height of said portion-to-be-delineated on said sample.

8. A method for correcting deflection distortion as defined in claim 7, wherein said mark is moved onto lattice points which are distributed with respect to an axis of said charged particle beam.

9. A method for correcting deflection distortion as defined in claim 7 or 8, wherein the corrections of the deflection distortions are made by interpolation on the basis of said correction magnitudes of said deflection distortions at said respective reference levels.

10. A method for correcting deflection distortion as defined in claim 7 or 8, wherein the two reference levels are set so that the height of said sample to be delineated may lie therebetween with a deformation of said sample taken into account.

11. A method for correcting deflection distortion as defined in claim 4, wherein said mark has two reference levels whose relative heights are known.

* * * * *